United States Patent
Kwon

(10) Patent No.: US 6,838,326 B2
(45) Date of Patent: Jan. 4, 2005

(54) SEMICONDUCTOR DEVICE, AND METHOD FOR MANUFACTURING THE SAME

(75) Inventor: Ho Yup Kwon, Seoul (KR)

(73) Assignee: Hynix Semiconductor, Inc., Ichon (KR)

( * ) Notice: Subject to any disclaimer, the term of this patent is extended or adjusted under 35 U.S.C. 154(b) by 0 days.

(21) Appl. No.: 10/329,680

(22) Filed: Dec. 27, 2002

(65) Prior Publication Data

US 2003/0122202 A1 Jul. 3, 2003

(30) Foreign Application Priority Data

Dec. 31, 2001 (KR) .................................. 10-2001-89165

(51) Int. Cl.$^7$ ............................................ H01L 21/338
(52) U.S. Cl. ...................... 438/183; 438/225; 438/297; 438/362; 438/425; 438/369
(58) Field of Search ................................. 438/183, 225, 438/297, 362, 369, 370, 425, 439, 450, 570

(56) References Cited

U.S. PATENT DOCUMENTS 6,017,823 A * 1/2000 Shishiguchi et al. ......... 438/696
6,528,854 B1 * 3/2003 Yoshida et al. .............. 257/395

* cited by examiner

Primary Examiner—David Nelms
Assistant Examiner—Long Tran
(74) Attorney, Agent, or Firm—Jacobson Holman

(57) ABSTRACT

The present invention discloses semiconductor device which comprises a metal gate electrode surrounded by polysilicon layers and a gate insulating film whose edges are thicker than the center portion formed according to a reoxidation process using a thermal process before the formation of an ion implantation region in a process for forming the metal gate electrode using a replacement process and method for manufacturing the same.

8 Claims, 5 Drawing Sheets

SEMICONDUCTOR DEVICE, AND METHOD FOR MANUFACTURING THE SAME

BACKGROUND

1. Technical Field

The present invention relates to semiconductor device and method for manufacturing the same, and more particularly, to semiconductor device which comprises a metal gate electrode surrounded by polysilicon layers and a gate insulating film whose edges are thicker than the center portion formed according to a reoxidation process using a thermal process before the formation of an ion implantation region in a process for forming the metal gate electrode using a replacement process to obtain semiconductor device improving its a yield and reliability.

2. Description of the Related Art

In order to achieve high integration and high speed operation of a device, a conventional method for manufacturing a metal-oxide-semiconductor field effect transistor (MOSFET) employs a metal as a gate material instead of polysilicon.

The conventional method for manufacturing the MOSFET includes a replacement gate process for forming a threshold voltage control ion implantation(Vth I/I) region, a gate oxide film and a gate after forming a source/drain region using a dummy gate.

When the replacement gate process is used, a thermal treatment can be sufficiently performed on a substrate to reduce a resistance of the source/drain region. In addition, characteristics of the transistor are improved because a high temperature thermal process after forming the Vth ion implantation region is not performed and the reliability of a gate insulating film is improved because plasma damage due to a gate etching process is prevented.

FIGS. 1a through 1d are cross-sectional diagrams illustrating sequential steps of the conventional method for manufacturing the transistor of the semiconductor device including the replacement gate process.

Referring to FIG. 1a, an element isolating film 12 defining an active region is formed on a p-type semiconductor substrate 11, and a gate insulating film(not shown), a polysilicon layer(not shown) and a photoresist film pattern(not shown) are sequentially formed in the active region.

A selective etching process is performed using the photoresist film pattern as a mask to remove a portion of the polysilicon layer and a portion of the oxide layer, thereby forming a dummy gate 16 which comprises a staked structure of a gate insulating film pattern 13 and a polysilicon layer pattern 15.

A source/drain region 17 is formed by implanting N-type impurity ions using the dummy gate 16 as a mask, and then performing a drive-in process thereon.

Referring to FIG. 1b, an interlayer insulating film 19 is formed over the entire structure including the dummy gate 16, and then planarized according to a chemical mechanical polishing process using the dummy gate 16 as an etch stop film.

Referring to FIG. 1c, an interlayer insulating film pattern 19-1 having a gate groove 20 exposing the semiconductor substrate 11 is formed by sequentially removing the exposed dummy gate 16 and the gate insulating film 13 according to a dry etching process. An ion implantation process and a thermal annealing process can be additionally performed, if necessary.

Referring to FIG. 1d, a gate insulating film 21 is reformed in the gate groove 20. A metal gate layer (not shown) is formed over the resulting structure including the gate insulating film 21 and the interlayer insulating film pattern 19-1, and then etched according to a CMP process using the interlayer insulating film 19-1 as an etch stop film to form a metal gate electrode 23.

However, in the above-described conventional method for manufacturing the transistor, an overlapped region of the Vth ion implantation region and the source/drain region, exists which results in large junction capacitance and poor reliability for hot carrier.

In addition, the transistor becomes unstable because of the exposed top portion of the metal gate electrode 23 which is easily contaminated during subsequent processes. When a surrounding process for forming an insulating film using SiN is additionally performed in order to solve the foregoing problem, coupling capacitances between layers are increased.

SUMMARY OF THE DISCLOSURE

It is an object of the present invention to provide a semiconductor device which comprises a metal gate electrode surrounded by polysilicon layers and a gate insulating film whose edges are thicker than the center portion formed by a thermal oxidation process, thereby providing improved reliability.

Another object of the present invention is to provide a method for fabricating a semiconductor device.

In order to achieve the above-described objects of the invention, there is provided a semiconductor device including:

a semiconductor substrate having a channel region, and an impurity region disposed at both sides of the channel region;

a first polysilicon layer disposed on a surface of the channel region;

a gate oxide film disposed between the first polysilicon layer and the surface of the channel region and extending laterally to have a width larger than that of the first polysilicon film, wherein a thickness of the edge of the gate oxide film is larger than that of the center portion thereof so as to surround side walls of the first polysilicon film;

a gate electrode, disposed on the first polysilicon film, comprising a metal layer and a second polysilicon layer surrounding the metal layer; and an insulating film spacer disposed on both sides of the gate electrode.

The gate oxide film is a thermal oxide film, Preferably, consists of a silicon oxide film($SiO_2$), a silicon nitride film(SiN) or a tantalum oxide film($Ta_2O_5$), and the oxidation process using the thermal annealing process is a general oxidation process using 5% partial pressure of oxygen gas at a temperature ranging from 700 to 900° C.

The impurity region comprises a low concentration impurity region extending from the both ends of the channel region and a high concentration impurity region extending from both sides of the a low concentration impurity region.

The low and the high concentration impurity regions are ion-implanted with a ion having a first conductive type and the channel region is ion-implanted with a ion having a second conductive type, and the first conductive type being an opposite conductive type to the second conductive type.

The metal layer consists of W or Al.

According to another aspect of the invention, a method for manufacturing a transistor of a semiconductor device comprises:

providing a semiconductor substrate having an element isolating film defining an active region;

forming a dummy gate comprising a gate oxide film, a first polysilicon layer and a hard mask layer sequentially stacked on the active region;

performing a thermal oxidation process to the overall surface to form a thermal oxide film on the sidewalls of the first polysilicon layer and the both sides of the gate oxide film, wherein the thermal oxidation film on the both sides of the gate oxide film is thicker than the gate oxide film;

forming a low concentration impurity region by performing a first ion implantation process on the entire surface including the dummy gate;

forming an insulating film over the resulting structure;

etching back the insulating film and the thermal oxide film on the semiconductor substrate to form an insulating film spacer on the sidewall of the dummy gate;

forming a high concentration impurity region in the semiconductor substrate on the both sides of the dummy gate electrode by performing a second ion implantation process;

forming a planarized interlayer insulating film for exposing the upper portion of the dummy gate;

removing the hard mask layer to form groove exposing the first polysilicon layer;

forming a Vth ion implantation region in a channel region of the semiconductor substrate by performing a third ion implantation process;

subjecting the resultant structure to a thermal annealing process;

sequentially forming a second polysilicon layer on the entire surface and a metal layer filling the groove;

etching back the metal layer to form a recessed metal pattern in the groove;

forming a third polysilicon layer overall surface of the resulting structure so as to fill the recess region in the groove; and planarizing the resultant to expose the interlayer insulating film.

The method can obtain a metal gate electrode surrounded with the polysilicon layers.

The gate oxide film is silicon oxide film, silicon nitride film or $Ta_2O_5$.

Preferably, the ion implantation process and the thermal annealing process use general methods. One of the N-type and P-type dopants are used in the first and the second ion implantation elements. Here, the first ion implantation dose is larger than the second ion implantation dose.

In addition, the polarities if the dopants used in the first and third ion implantation process are opposite each other.

According to the Vth ion implantation region is formed on the surface of the center portion of the channel region and both edges of the channel are blocked by the gate thermal oxide film.

The step of removing the nitride film as hard mask layer is performed by dry etching process.

Preferably, the metal layer consists of W or Al.

In accordance with the preset invention, the method for manufacturing the transistor employs the selective oxidation process wherein the edges of the gate electrode is formed thicker than the center portion thereof.

When the ion implantation process is performed to form the Vth ion implantation region, the high concentration impurity region does not overlap so that a maximal electric field value can be decreased and a junction capacitance is impurity region does not overlap so that a maximal electric field value can be decreased and a junction capacitance is reduced to improve reliability for hot carrier.

Moreover, the stable transistor can be obtained because the metal gate electrode is not contaminated during subsequent processes due to surrounding polysilicon layers that covers the top portion of the metal gate electrode.

DETAILED DESCRIPTION OF THE PREFERRED EMBODIMENTS

Figure 1A:
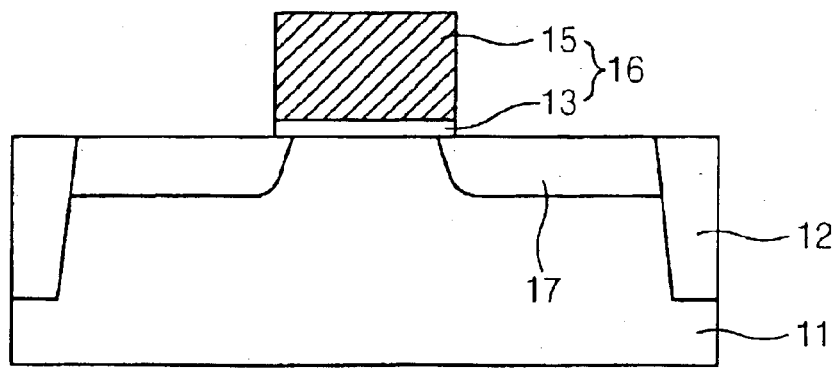
FIGS. 1a through 1d are cross-sectional diagrams illustrating method for manufacturing a semiconductor device in accordance with the conventional art.
Figure 1B:
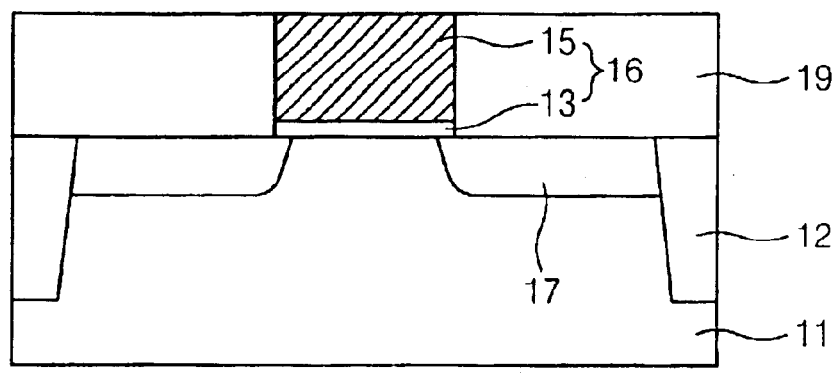
Figure 1C:
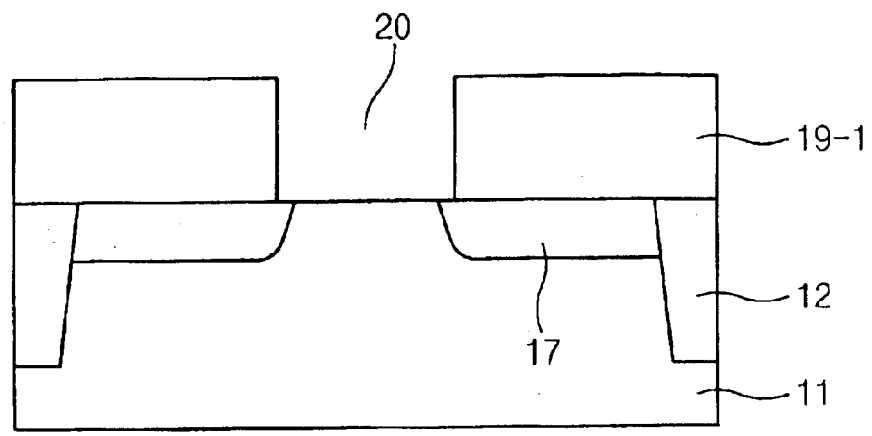
Figure 1D:
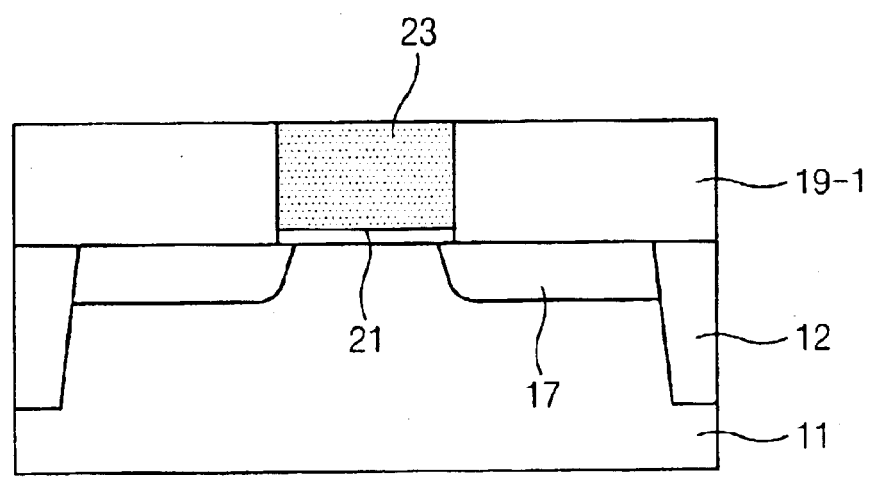

A semiconductor device and a method for manufacturing the same will be described in greater detail while referring to the drawings.

Figure 2A:
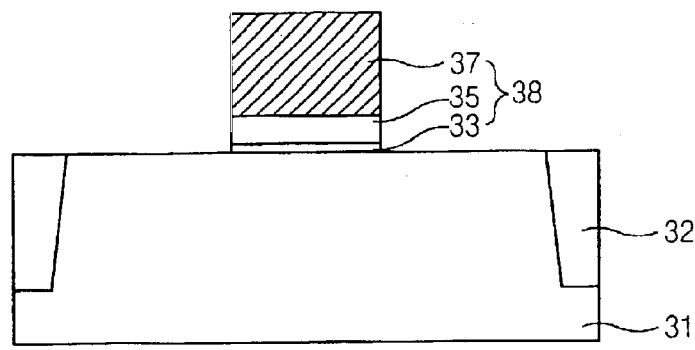
FIGS. 2a through 2g are cross-sectional diagrams illustrating method for manufacturing a semiconductor device in accordance with the disclosed methods.

Referring to FIG. 2a, a gate oxide film(not shown), a first polysilicon layer(not shown) and a nitride film(not shown) are sequentially formed on a p-type semiconductor substrate 31 having an element isolating film 32.

A dummy gate electrode 38 composed of a gate oxide film pattern 33, a first polysilicon layer pattern 35 and a nitride film pattern 37 which is a hard mask layer is formed by patterning the nitride film, the first polysilicon layer and the gate oxide film according to a photo-etching process using a mask for gate electrode(not shown).

Figure 2B:
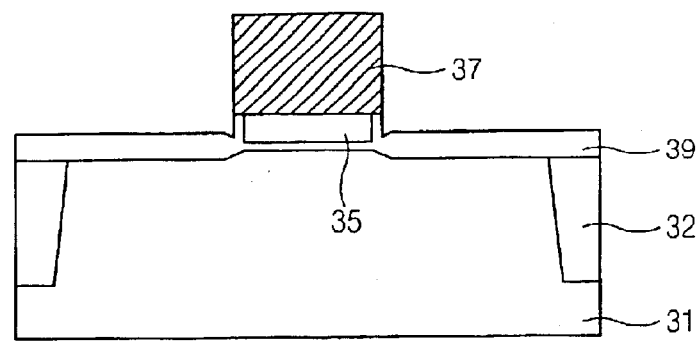

Referring to FIG. 2b, a gate thermal oxide film 39 the edge of which is thicker than its center portion is formed on the sidewall of the first polysilicon layer pattern 35, at the edge portion of the gate oxide film pattern 33 and on the upper portion of the semiconductor substrate 31 by performing a re-oxidation process on the resulting structure.

Figure 2C:
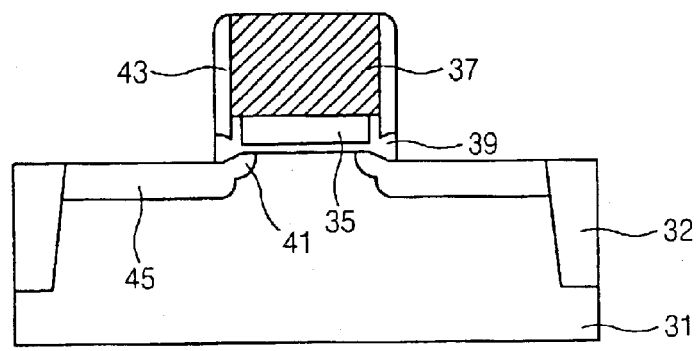

Referring to FIG. 2c, a low concentration impurity region 41 is formed in the semiconductor substrate 31 at both sides of the first polysilicon layer 35 by implanting n-type impurity ions having low concentration and low energy using the first polysilicon layer pattern 35 as a mask, and then performing a drive-in process.

An oxide film(not shown) is formed on the entire surface and then etched back to form an oxide film spacer 43 on the sidewall of the dummy gate electrode 38. A portion of the thermal oxide film 39 on the semiconductor substrate 31 is also removed by the etch-back process.

Thereafter, a high concentration impurity region 45 is formed in the semiconductor substrate 31 at both sides of the dummy gate electrode 38 including the oxide film spacer 43 by implanting n-type impurity ions having high concentration and high energy using the oxide film spacer 43 and the dummy-gate electrode 38 as a mask and then performing a drive-in process.

Figure 2D:
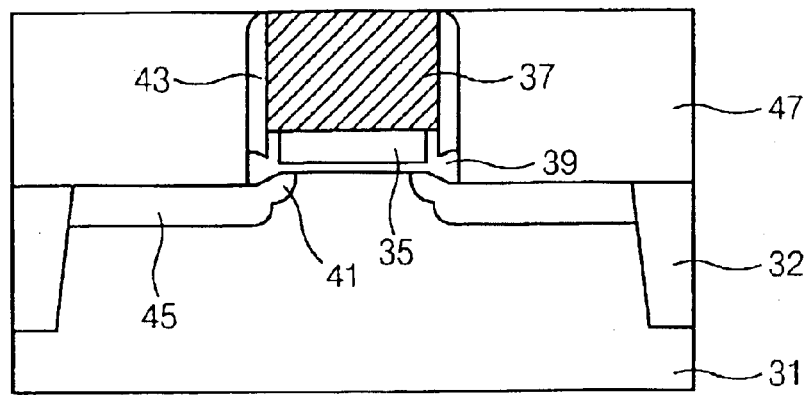
Figure 2E:
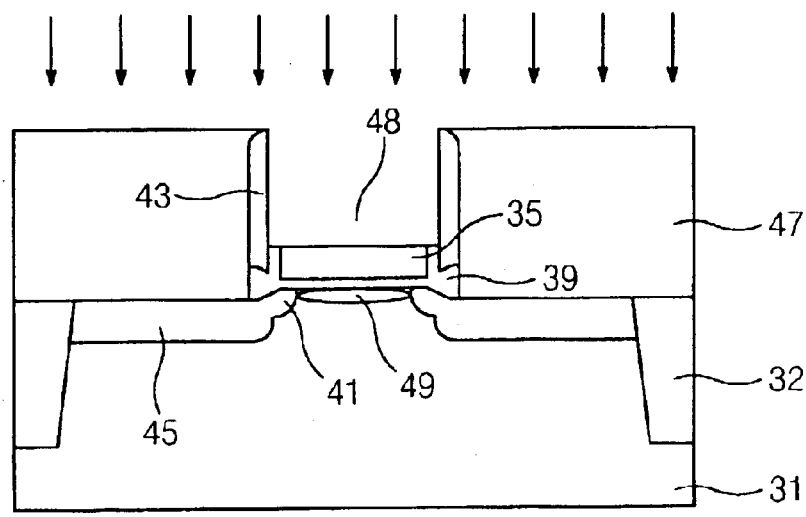

Referring to FIG. 2d, an interlayer insulating film 47 is formed over the entire surface, and then planarized according to a CMP process using the nitride film pattern 37 as an etch stop film.

Referring to 2e, a groove exposing the first polysilicon layer pattern 35 is formed by removing the exposed nitride film pattern 37 according to a dry etching process. A Vth ion implantation region 49 is formed by performing a Vth ion implantation process and a drive-in process on the resulting structure, and then a thermal annealing process is performed.

Here, by controlling the Vth ion implantation energy impurities are concentrated on the surface of the center portion of the channel region and blocked at both edges of the channel region by the thermal oxide film 39.

Figure 2F:
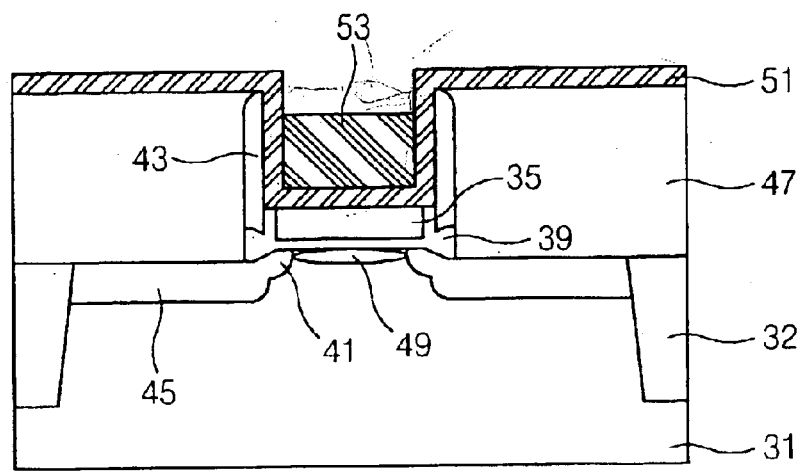

Referring to FIG. 2f, a second polysilicon layer 51 and a tungsten layer(not shown) are sequentially formed on the entire surface including the interlayer insulating film 47. The tungsten layer(not shown) is etched back so that only a tungsten layer pattern 53 remains in the groove 48.

Figure 2G:
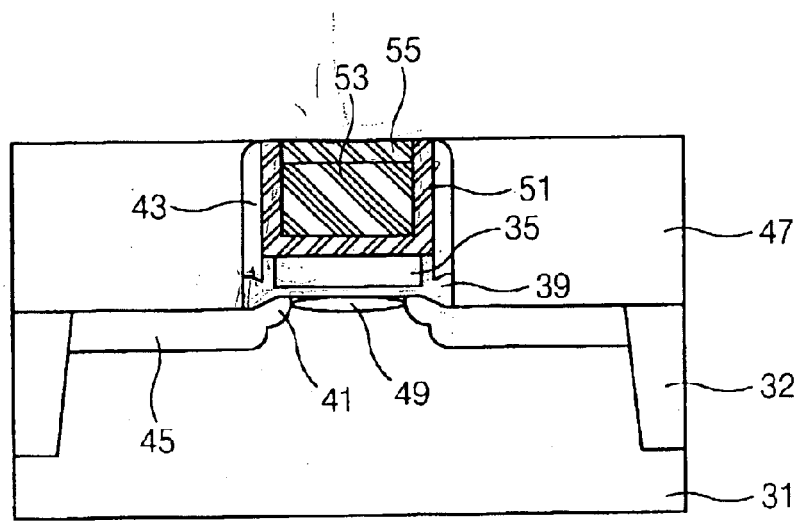

Referring to FIG. 2g, a third polysilicon layer(not shown) is formed on the entire surface including the groove 48. The second polysilicon layer 51 and third polysilicon layers(not shown) are planarized according to a planarization process using the interlayer insulating film 47 as an etch stop film, thereby forming a gate electrode having the first polysilicon layers pattern 35, second polysilicon layers pattern 51 and third polysilicon layers pattern 55 surrounding the tungsten layer 53.

As discussed earlier, because the present invention employs conventional MOSFET manufacturing methods, a resistance of the source/drain region is reduced and plasma damage due to the gate etching process is prevented.

In addition, because the gate oxide film whose edge is thicker than the center portion formed by selective oxidation process is employed, the source/drain region does not overlap when the ion implantation process is performed for forming the Vth ion implantation region result in decrease of electric field value. Therefore, the junction capacitance is reduced to improve reliability on hot carrier.

What is claimed is:

1. A method for manufacturing a semiconductor device comprising the steps of:

providing a semiconductor substrate having an element isolating film defining an active region;

forming a dummy gate comprising a gate oxide film, a first polysilicon layer and a hard mask layer sequentially stacked on the active region;

performing a thermal oxidation process to the overall surface to form a thermal oxide film on the sidewalls of the first polysilicon layer and on the both sides of the gate oxide film, wherein the thermal oxidation film on the both sides of the gate oxide film is thicker than the gate oxide film;

forming a low concentration impurity region by performing a first ion implantation process on the entire surface including the dummy gate;

forming an insulating film over the resulting structure;

etching back the insulating film and the thermal oxide film on the semiconductor substrate to form an insulating film spacer on the sidewall of the dummy gate;

forming a high concentration impurity region in the semiconductor substrate on the both sides of the dummy gate electrode by performing a second ion implantation process;

forming a planarized interlayer insulating film for exposing the upper portion of the dummy gate;

removing the hard mask layer to form groove exposing the first polysilicon layer;

forming a Vth ion implantation region in a channel region of the semiconductor substrate by performing a third ion implantation process;

subjecting the resultant structure to a thermal annealing process;

sequentially forming a second polysilicon layer on the entire surface and a metal layer filling the groove;

etching back the metal layer to form a recessed metal pattern in the groove;

forming a third polysilicon layer overall surface of the resulting structure so as to fill the recess region in the groove; and planarizing the resultant to expose the interlayer insulating film.

2. The method according to claim 1, wherein the gate oxide film is a silicon oxide film, a silicon nitride film or a tantalum oxide film.

3. The method according to claim 1, wherein dopant used in the first and the second ion implantation processes is N-type or P-type.

4. The method according to claim 1, wherein the polarities of the dopants used in the first and third ion implantation process are opposite each other.

5. The method according to claim 1, wherein the ion implantation region is formed on the surface of the center portion of the channel region.

6. The method according to claim 1, wherein the hard mask layer comprises a nitride film.

7. The method according to claim 1, wherein the step of removing the hard mask is performed by dry etching process.

8. The method according to claim 1, wherein the metal layer is tungsten or aluminum layer.

* * * * *